(12) United States Patent
Koch et al.

(10) Patent No.: US 6,720,635 B1
(45) Date of Patent: Apr. 13, 2004

(54) ELECTRONIC COMPONENT

(75) Inventors: Daniel J. Koch, Mesa, AZ (US);
Bishnu Prasanna Gogoi, Scottsdale, AZ (US); Raymond M. Roop, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/466,337

(22) Filed: Dec. 17, 1999

(51) Int. Cl.[7] .................. H01L 29/84; H01L 31/058
(52) U.S. Cl. .................. 257/417; 257/467; 257/469
(58) Field of Search .................. 257/417, 467, 257/469, 470, 254, 419, 415, 777

(56) References Cited

U.S. PATENT DOCUMENTS

| 5,194,402 | A |   | 3/1993  | Ehrfeld et al. ............ 437/180 |
| 5,504,026 | A |   | 4/1996  | Kung ..................... 437/51 |
| 5,510,276 | A | * | 4/1996  | Diem et al. ......... 148/DIG. 135 |
| 5,578,167 | A |   | 11/1996 | Sooriakumar et al. ... 156/654.1 |
| 5,595,940 | A |   | 1/1997  | Trah et al. ............... 437/225 |
| 5,798,283 | A |   | 8/1998  | Montague et al. ........... 438/24 |
| 5,955,771 | A | * | 9/1999  | Kurtz et al. ............... 257/419 |
| 6,022,765 | A | * | 2/2000  | Kim ..................... 438/151 |
| 6,117,701 | A | * | 9/2000  | Buchan et al. ............. 438/52 |
| 6,174,820 | B1 | * | 1/2001  | Habermehl et al. ......... 216/11 |
| 6,248,610 | B1 | * | 6/2001  | Leonardson et al. ......... 438/50 |
| 6,391,674 | B2 | * | 5/2002  | Ziegler .................... 438/50 |

* cited by examiner

Primary Examiner—Amir Zarabian
Assistant Examiner—Kiesha Rose

(57) ABSTRACT

An electronic component includes a composite semiconductor substrate (110, 810) having a first side (111) opposite a second side (112), a semiconductor device (160, 170) at the first side of the composite semiconductor substrate, and a transducer (400, 600, 900) at the second side of the composite semiconductor substrate.

21 Claims, 5 Drawing Sheets

ELECTRONIC COMPONENT

BACKGROUND OF THE INVENTION

This invention relates, in general, to electronics, and more particularly, to electronic components and methods of manufacture.

Systems for sensing inertia are often comprised of two chips. The first chip contains the inertial sensing device, and the second chip contains the control circuitry. However, these two chip inertial sensing systems have several problems. For example, these systems have poor signal-to-noise ratio performance. Furthermore, these systems also have a large parasitic capacitance resulting from the interconnection of the two chips.

Recently, the two chip inertial sensing systems have been integrated into a single chip, or monolithic, system. These monolithic systems have a higher signal-to-noise ratio performance versus the two chip inertial sensing systems. The improved signal-to-noise ratio enables the construction of a low g inertial sensor or yaw rate sensor. These monolithic systems also reduce the parasitic capacitance of the interconnection between the control circuitry and the inertial sensing device.

In these monolithic systems, the inertial sensing device, or the transducer, is located on the same surface of the substrate as the control circuitry. This configuration places significant constraints on the construction of the control circuitry and the transducer. Some of these constraints limit the size and performance of the transducer. For example, one typical constraint limits the thickness of the movable portion of the transducer. Other constraints limit the size and functionality of the devices in the control circuitry.

Accordingly, a need exists for an improved monolithic system or electronic component that has fewer constraints to limit the size and functionality of the transducer and the devices of the control circuitry.

BRIEF DESCRIPTION OF THE DRAWINGS

The present invention will be better understood from a reading of the following detailed description, taken in conjunction with the accompanying drawing figures in which.

Figure 1:
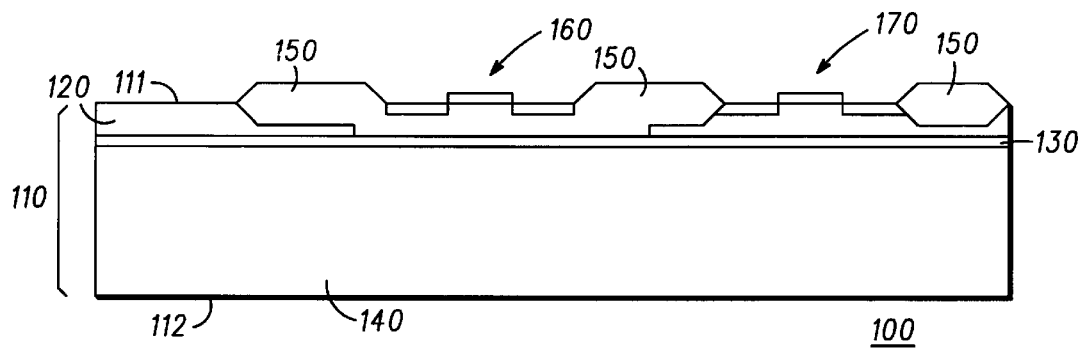
FIGS. 1 through 4 illustrate cross-sectional views of a portion of an embodiment of an electronic component during different stages of a manufacturing in accordance with the present invention.

For simplicity and clarity of illustration, elements in the figures are not necessarily drawn to scale, and the same reference numerals in different figures denote the same elements. Additionally, descriptions and details of well-known features and processing techniques are omitted to avoid unnecessarily obscuring the present invention.

BRIEF DESCRIPTION OF THE DRAWINGS

FIG. 1 illustrates a cross-sectional view of a portion of an electronic component 100 after several initial stages of a manufacturing process. As will be shown hereinafter, component 100 includes a composite semiconductor substrate having a first side opposite a second side. An integrated circuit will be located at the first side of the composite semiconductor substrate, and a transducer will be located at the second side of the composite semiconductor substrate.

As illustrated in FIG. 1, component 100 includes a composite semiconductor substrate 110 having a first surface or side 111 opposite a second surface or side 112. Substrate 110 includes a first semiconductor layer 120 at side 111 and a second semiconductor layer 140 at side 112. Substrate 110 also includes an electrically insulative layer 130 located between layers 120 and 140. Layer 120 has a first thickness, and layer 140 has a second thickness. In the preferred embodiment, the thickness of layer 140 is greater than layer 120. As an example of the preferred embodiment, substrate 110 can be a silicon-on-insulator substrate, and layers 120, 130, and 140 can be a first silicon layer, a silicon dioxide layer, and a second silicon layer, respectively.

Also in the preferred embodiment, layers 120 and 140 are doped to be electronically conductive. Furthermore, layer 120 preferably has a silicon crystal structure that is different than the silicon crystal structure of layer 140. As an example, layer 120 can have a silicon crystal structure with a <100> direction. Layer 140 can have a silicon crystal structure with a <110> direction or may have a polysilicon structure. The preferred embodiment of layer 140 is the silicon crystal structure that facilitates the fabrication of the transducer in layer 140, as discussed hereinafter.

Layer 120 has a thickness suitable for an appropriate integrated circuit technology. In the preferred embodiment, layer 120 has a thickness of approximately 0.1–6 micrometers. Layer 130 should be thick enough to serve as an etch stop during the subsequent patterning of layer 120. In the preferred embodiment, layer 130 has a thickness of approximately 0.2 to 2.0 micrometers. Also in the preferred embodiment, layer 140 has a thickness of approximately 350 to 650 micrometers. This thickness of layer 140 enables a transducer that is subsequently formed in layer 140 to have a smaller footprint than otherwise possible in the prior art.

Next, electrical isolation regions 150 are formed at side 111. Regions 150 can be formed in layer 120 using techniques known in the art. As an example, regions 150 can be formed by a field oxidation process or a trench isolation process.

Semiconductor devices 160 and 170 are subsequently formed at side 111. At least a portion of devices 160 and 170 are preferably formed in layer 120 of substrate 110. In the preferred embodiment, devices 160 and 170 are transistors that are subsequently electrically coupled together to form an integrated circuit at side 111. In an alternative embodiment, devices 160 and 170 can represent sensors such as, for example, chemical or temperature sensors.

Figure 2:
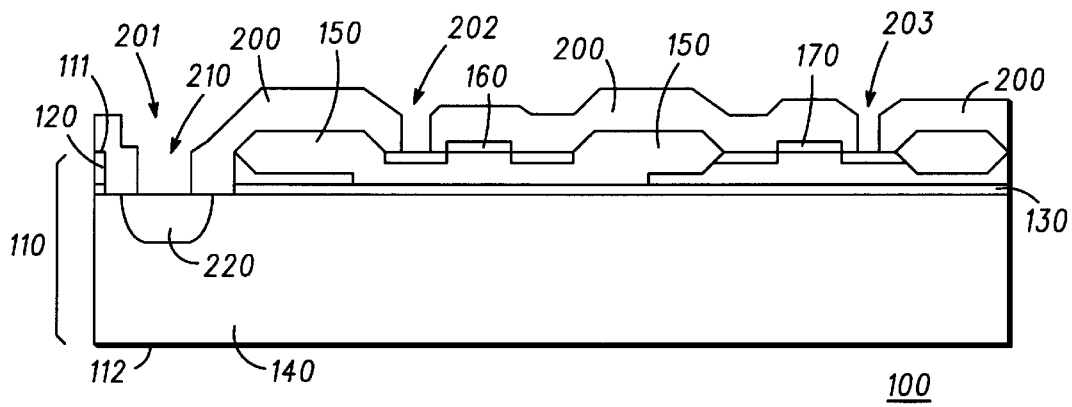

FIG. 2 illustrates a cross-sectional view of the portion of component 100 after further stages in the manufacturing process. A hole or via 210 is etched through layers 120 and 130. As an example, an isotropic etchant comprised of nitrogen tri-fluoride ($NF_3$), sulfur hexafluoride ($SF_6$), or tetra-methyl-amonium-hydroxide (TMAH) can be used to form via 210 in layer 120, and an anisotropic etchant such as, for example, carbon tetra-fluoride ($CF_4$) can be used to form or extend via 210 through layer 130. Via 210 extends through layers 120 and 130 to expose an underlying portion of layer 140.

Next, an electrically insulative layer 200 is disposed over side 111 to cover devices 160 and 170. Layer 200 is also disposed in via 210. As an example, layer 200 can be comprised of an oxide such as, for example, silicon dioxide, that may be thermally grown or deposited from tetra-ethyl-ortho-silicate (TEOS), or boron-phospho-silicate-glass (BPSG). In the preferred embodiment, layer 200 can have a thickness of approximately 1 to 2 micrometers. Layer 200 is subsequently patterned to form vias 201, 202, and 203. Via 201 is formed within via 210 to expose the underlying portion of layer 140.

Then, a heavily doped region 220 is formed in layer 140 through via 201. As an example, region 220 can be formed by an ion implantation process. Region 220 has the same conductivity type as layer 140. Region 220 can also be formed in layer 140 by an ion implantation process occurring before the deposition of layer 200, and region 220 can alternatively be formed later in the manufacturing process by a diffusion process during a high temperature anneal if a subsequently formed interconnect layer is comprised of doped polysilicon.

Figure 3:
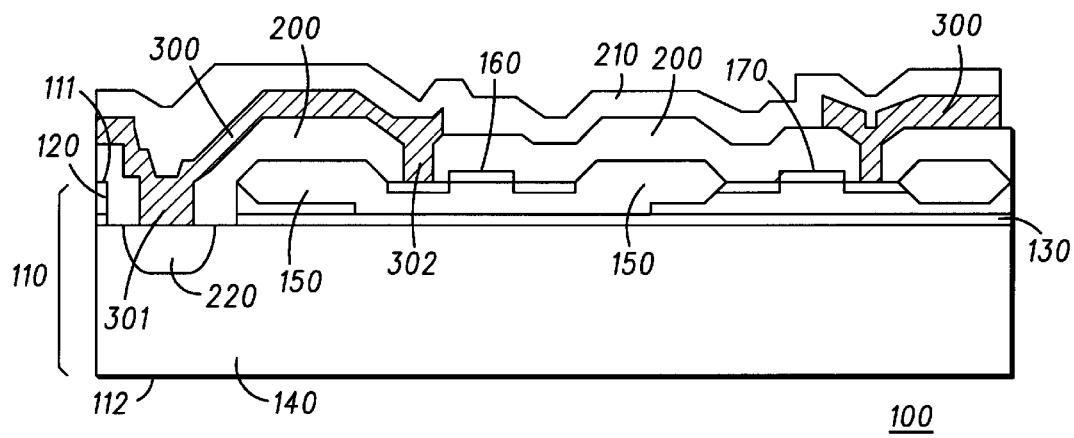

FIG. 3 illustrates a cross-sectional view of the portion of component 100 after even further stages of the manufacturing process. An interconnect system is formed over side 111 of substrate 110 to electrically couple together devices 160 and 170 and other features (not shown in FIG. 3) of the integrated circuit at side 111. FIG. 3 illustrates a single-layered interconnect system, but one skilled in the art will recognize that a multi-layered interconnect system can also be used in component 100. The interconnect system includes an interconnect layer 300 that is patterned. Layer 300 forms an electrical contact 301 to layer 140 and also forms an electrical contact 302 to device 160. Contact 301 is located within vias 201 and 210 (FIG. 2). Region 220 reduces the parasitic contact resistance between layers 140 and 300.

After forming the interconnect system, a passivation layer 310 is disposed over side 111. Layer 310 protects the underlying structures including interconnect layer 300, contacts 301 and 302, and devices 160 and 170 from the etchant subsequently used to define the transducer in layer 140. Although not illustrated in FIG. 3, passivation layer 310 should be opened over the bond pads (not shown in FIG. 3) for external electrical contact.

Figure 4:
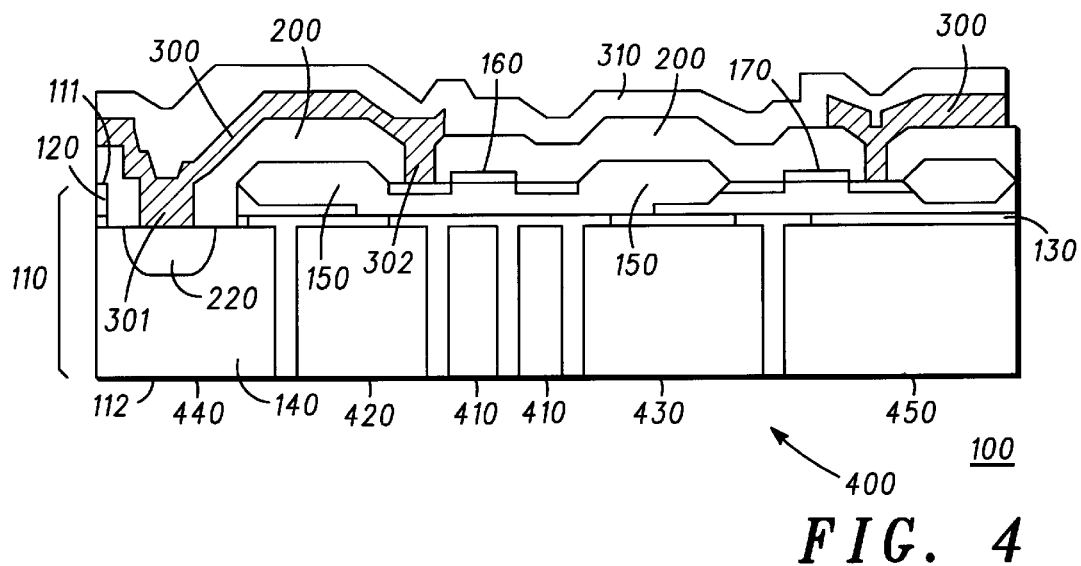

FIG. 4 illustrates a cross-sectional view of the portion of component 100 after still further stages of the manufacturing process. In FIG. 4, at least a portion of a transducer 400 is formed in layer 140. In the preferred embodiment, transducer 400 is an electro-mechanical transducer such as, for example, an accelerometer having portions 410, 420, 430, 440, and 450. In the cross-sectional view of FIG. 4, it is noted that portions of layer 130 are absent directly between the devices of the integrated circuit and portions 410 of transducer 400 such that portions 410 are not directly coupled to the other portions of substrate 110. However, as discussed in subsequent figures, portions 410 form a seismic mass suspended under the integrated circuit at side 111 of substrate 110. Transducer 400 can be positioned directly underneath devices 160 and 170 by using a conventional frontside-to-backside aligner.

To facilitate the patterning of transducer 400 in layer 140, layer 140 is preferably comprised of a silicon layer having a crystalline structure with a <110> direction, as stated hereinbefore. With this type of crystalline structure, layer 140 can be etched along its crystalline boundaries to provide a more precise configuration of transducer 400. As an example, potassium hydroxide (KOH) or TMAH can be used to anisotropically etch or pattern layer 140. However, dry etching techniques can also be used to pattern layer 140, as shown in FIG. 4.

After patterning layer 140, portions of layer 130 are exposed. These exposed portions of layer 130 are subsequently isotropically etched into the configuration illustrated in FIG. 4. As an example, a buffered oxide etchant, hydrofluoric acid (HF), or acetic acid can be used to isotropically pattern layer 130. This isotropical etch process will remove the portions of layer 130 that contact portions 410 of transducer 400 in order to release portions 410 from the remaining portions of substrate 110. However, the other portions of transducer 400, such as portions 420, 430, 440, and 450, remain attached to the other portions of substrate 110 and therefore remain stationary relative to those other portions of substrate 110. This isotropic etch process can be performed using a fixture similar to that described in U.S. Pat. No. 5,578,167, which is incorporated herein by reference. With component 100 in the fixture, only side 112 of substrate 110 is exposed to the etchant, and the devices, interconnect system, and passivation layer are protected from the etchant by the fixture.

Figure 5:
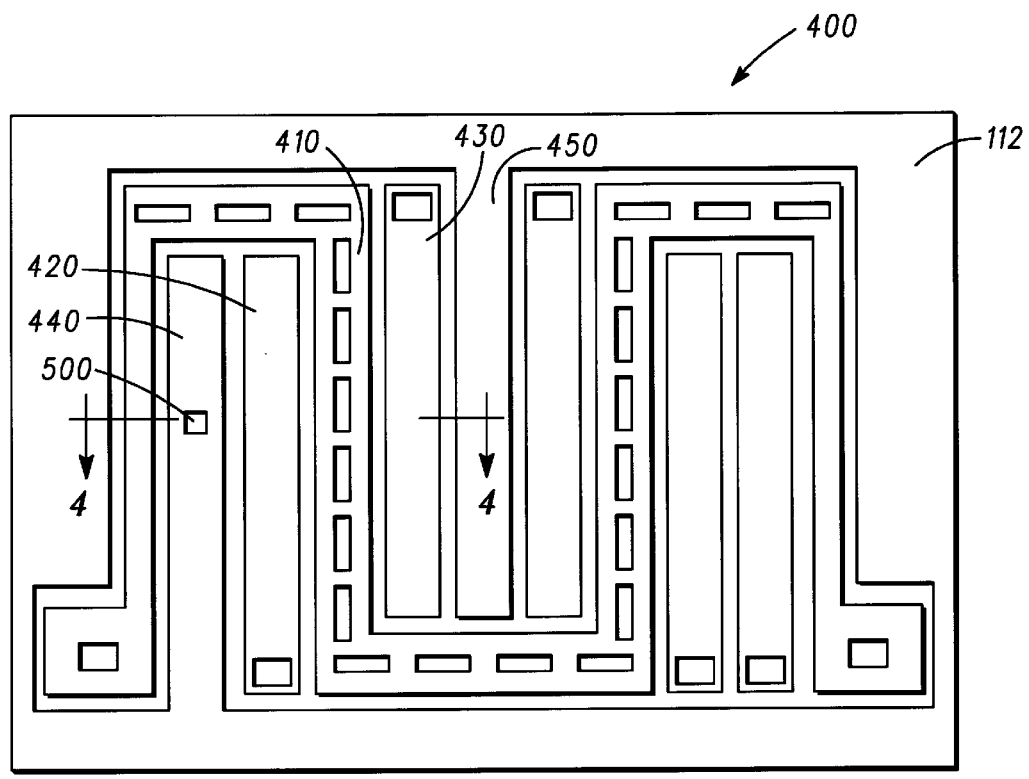
FIGS. 5 and 6 illustrate bottom views of different embodiments of the electronic component in FIG. 4.

FIG. 5 illustrates a bottom view of a portion of electronic component 100. A section line 4—4 in FIG. 5 illustrates the portion of component 100 depicted in cross-sectional view in FIG. 4. As illustrated in FIG. 5, transducer 400 has movable portions 410 and stationary portions 420, 430, 440, and 450. Portions 420 and 430 are stationary electrodes and, combined with movable portion 410, form a differential capacitor. Portions 440 and 450 form a shield plate for transducer 400. Region 500 in FIG. 5 represents the location of contact 301 (FIG. 4) at side 111 (FIG. 4). Contact 301 (FIG. 4) provides the appropriate electrical biasing of portions 440 and 450 of transducer 400 from the opposite side of substrate 110.

As evident from FIGS. 4 and 5, transducer 400 has an axis of sensitivity that is substantially parallel to sides 111 and 112. Furthermore, devices 160 and 170 are located directly over transducer 400. This configuration of transducer 400 enables the reduction in size of component 100 compared to the prior art. Furthermore, the size of transducer 400 can also be reduced compared to the sizes of transducers in the prior art because of the larger thickness of layer 140. This configuration also reduces the parasitic capacitance of the interconnection between devices 160 and 170 and transducer 400.

Figure 6:
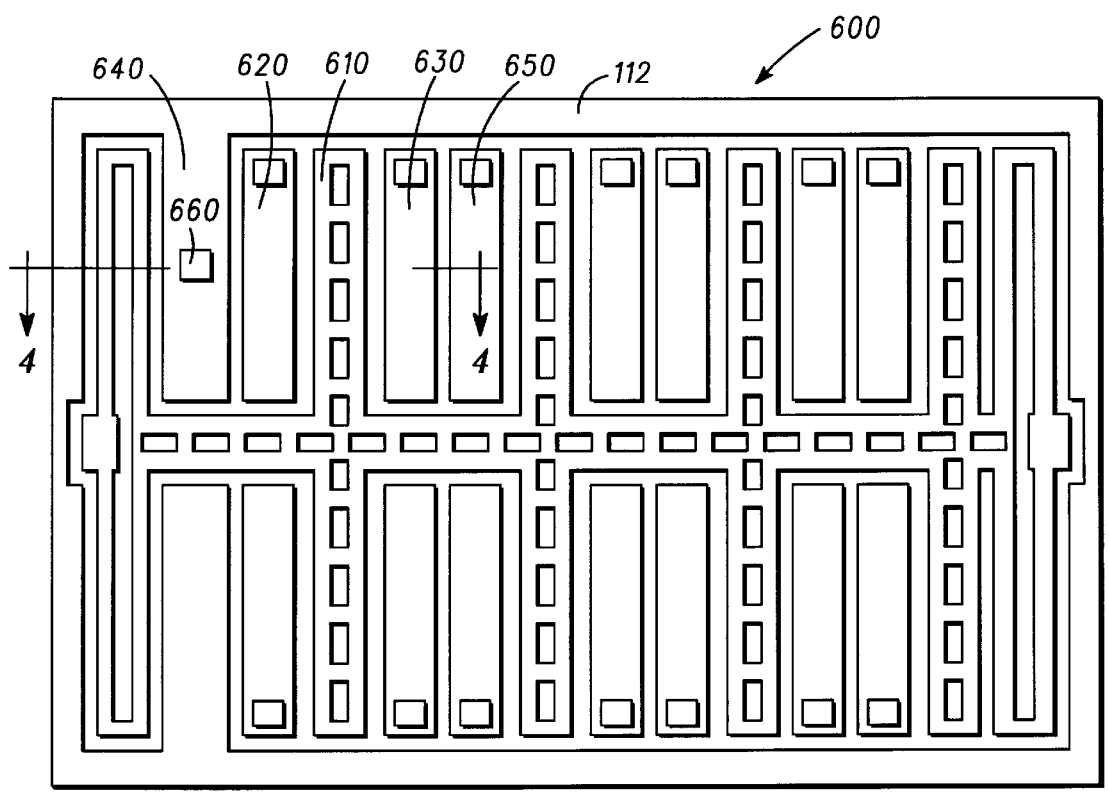

FIG. 6 illustrates a bottom view of an electronic component 670, which is a different embodiment of component 100 in FIG. 5. Component 670 includes a transducer 600, which is similar to transducer 400 in FIG. 5. Transducer 600 includes a movable portion 610, which is similar to portions 410 in transducer 400 (FIG. 5). Transducer 600 also includes stationary electrode portions 620, 630, and 650, which are similar to portions 420 and 430 of transducer 400 (FIG. 5). Transducer 600 further includes a shield plate 640, which is similar to portions 440 and 450 of transducer 400 (FIG. 5). Additionally, region 660 in FIG. 6 identifies the location of contact 301 (FIG. 4) at the opposite side of substrate 110 (FIG. 4).

Figure 7:
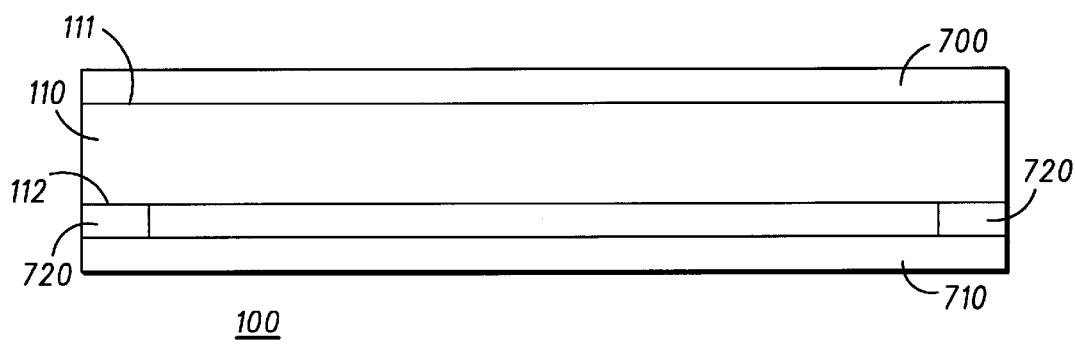
FIG. 7 illustrates a schematic cross-sectional view of the electronic component after additional stages of the manufacturing process in accordance with the present invention.

FIG. 7 illustrates a schematic cross-sectional view of component 100 after additional stages of the manufacturing process. Element 700 in FIG. 7 represents the interconnect system and passivation layer illustrated in FIG. 4. A protective structure or cap 710 is provided at side 112. Cap 710 protects the transducer at side 112 from particulates and moisture. Cap 710 can be coupled or bonded to substrate 110 by an adhesive 720, which can be comprised of bonded glass.

Figure 8:
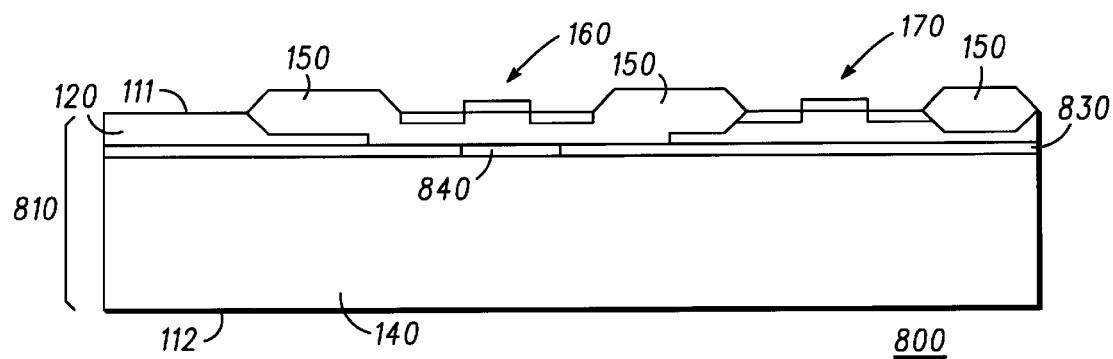
FIGS. 8 and 9 illustrate cross-sectional views of a portion of a different embodiment of the electronic component in FIGS. 1 and 4, respectively.

FIG. 8 illustrates a cross-sectional view of a portion of an electronic component 800, which is a different embodiment of component 100 in FIG. 1. Among other features, component 800 includes a composite semiconductor substrate 810, which is similar to substrate 110 in FIG. 1. Substrate 810 includes an electrically insulative layer 830, which is similar to layer 130 in FIG. 1. However, layer 830 in FIG. 8 includes a gap or hole 840. Hole 840 facilitates the subsequent manufacturing of a transducer in layer 140. As an example, substrate 810 can be formed by first forming layer 830 on layer 140 and then by forming hole 840 into layer 830. Then, layer 120 can be bonded to layer 830, which forms a microcavity in layer 830 defined by hole 840. In alternative embodiments, the microcavity can be formed by a recess or a plurality of recesses in substrate 120, substrate 140, or both. Where a plurality of recesses are used, the recesses can have different depths.

Figure 9:
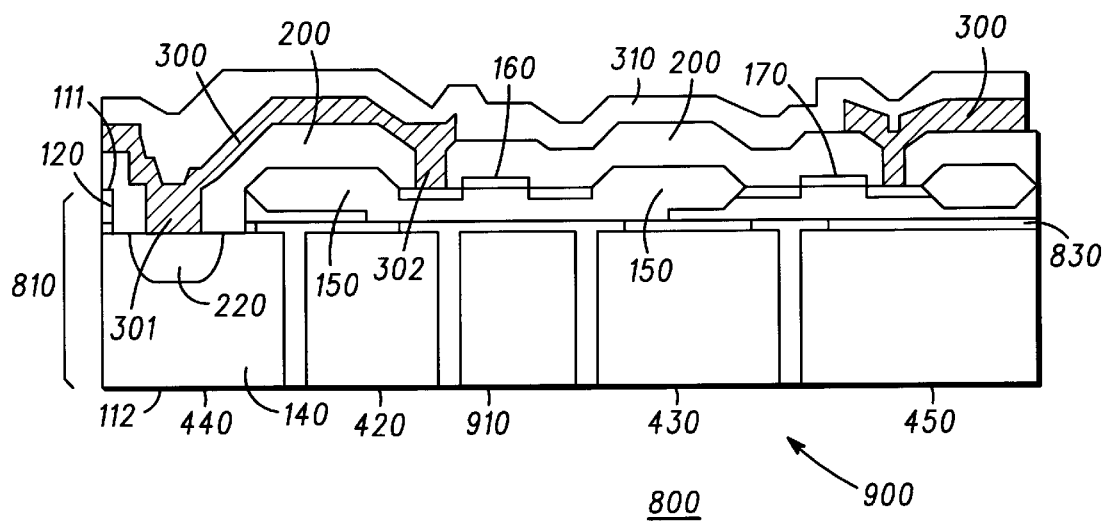
Figure 10:
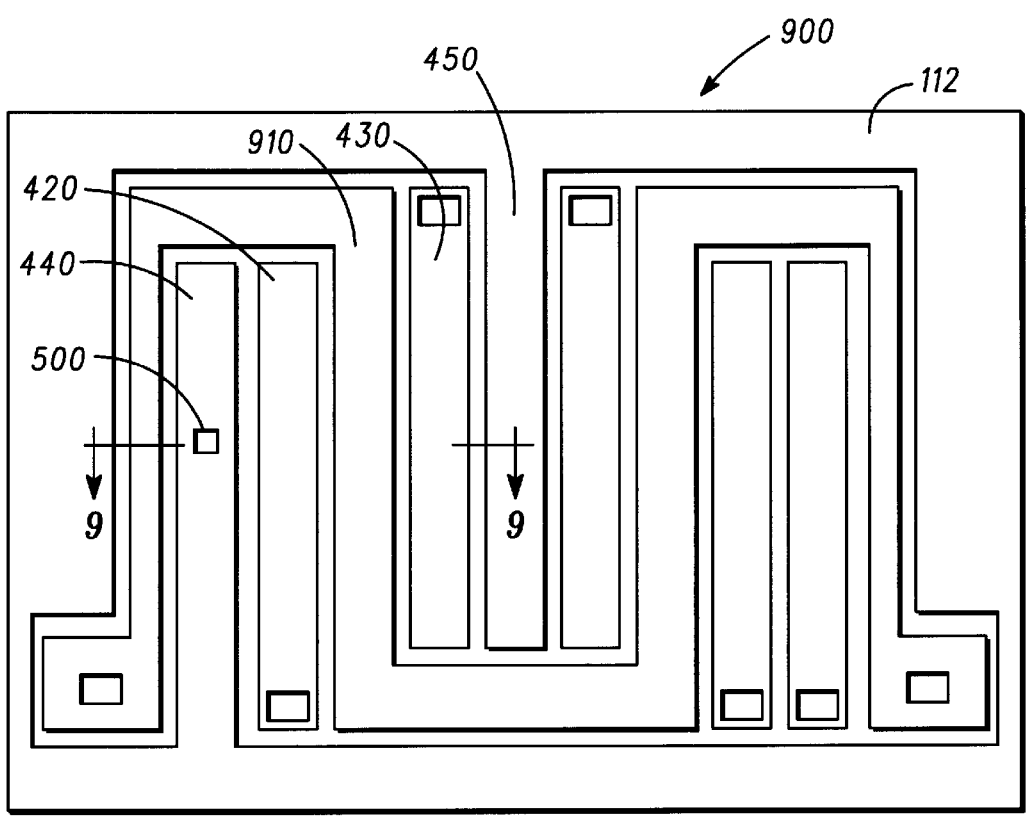
FIG. 10 illustrates a bottom view of the electronic component in FIG. 9.

FIG. 9 illustrates a cross-sectional view of the portion of component 800, and FIG. 10 illustrates a bottom view of component 800. A section line 9—9 in FIG. 10 illustrates the portion of component 800 depicted in cross-sectional view in FIG. 9. FIGS. 9 and 10 illustrate component 800 to include a transducer 900, which is similar to transducer 400 in FIGS. 4 and 5. As illustrated in FIGS. 9 and 10, transducer 900 includes a seismic mass portion 910, which is similar to portion 410 in FIGS. 4 and 5. Transducer 900 can be fabricated in a manner similar to that used for transducer 400 in FIGS. 4 and 5. However, portion 910 of transducer 900 can be a solid piece without any through holes, unlike portion 410 in FIGS. 4 and 5, because of the use of the microcavity defined by hole 840 (FIG. 8) in layer 830. The microcavity in layer 830 facilitates the release of movable portion 910 without requiring the etching of holes through portion 910. Alternatively, the use of a microcavity in layer 830 can be combined with holes in the seismic mass portion of the transducer in order to increase the size or unit area of the seismic mass portion. In yet another alternative embodiment where a large microcavity is used, the etching of substrate 140 to pattern transducer 900 can release portion 910, and a subsequent etch step for layer 830 is not needed.

Therefore, an improved electronic component, or monolithic inertial sensing system, is provided to overcome the disadvantages of the prior art. The component described herein has fewer constrains to limit the size and functionality of the transducer portion of the component and the individual devices in the integrated circuit of the component. Additionally, the vertical stacking of the transducer and the integrated circuit enable the manufacture of a smaller component.

While the present invention has been particularly shown and described mainly with reference to specific embodiments, it will be understood by those skilled in the art that various changes in form and detail may be made to the embodiments herein without departing from the spirit or scope of the present invention. For instance, the numerous details set forth herein such as, for example, the material compositions and the thicknesses of the layers are provided to facilitate the understanding of the present invention and are not provided to limit the scope of the present invention. Furthermore, while an inertial sensor is described in detail herein, one skilled in the art will recognize that the concepts disclosed herein can be applied to other types of monolithic transducers including, but not limited to, pressure sensors.

Accordingly, the disclosure of the present invention is not intended to be limiting. Instead, the disclosure of the embodiments of the present invention is intended to be illustrative of the scope of the present invention. It is intended that the scope of the present invention shall be limited only to the extent required by the appended claims.

The appended claims are not to be interpreted as including means-plus-function limitations, unless such a limitation is expressly recited in a given claim using the phrase "means for".

What is claimed is:

1. An electronic component comprising:

a composite semiconductor substrate having a first side opposite a second side;

a semiconductor device at the first side of the composite semiconductor substrate; and a transducer at the second side of the composite semiconductor substrate.

2. The electronic component of claim 1 wherein:

the semiconductor device is located directly over the transducer.

3. The electronic component of claim 1 wherein:

the transducer has an electrical contact extending through a portion of the composite semiconductor substrate and located at the first side of the composite semiconductor substrate.

4. The electronic component of claim 1 wherein:

the transducer is an accelerometer having an axis of sensitivity substantially parallel to the first and second sides of the composite semiconductor substrate.

5. The electronic component of claim 1 wherein:

the composite semiconductor substrate further comprises a first semiconductor layer at the first side of the composite semiconductor substrate, a second semiconductor layer at the second side of the composite semiconductor substrate, and an electrically insulative layer located between the first and second semiconductor layers.

6. The electronic component of claim 5 wherein:

the first semiconductor layer has a first thickness, wherein the second semiconductor layer has a second thickness, and wherein the second thickness is greater than the first thickness.

7. The electronic component of claim 5 wherein:

at least a portion of the semiconductor device is formed in the first semiconductor layer and wherein at least a portion of the transducer is formed in the second semiconductor.

8. The electronic component of claim 7 wherein:

the transducer has a portion movable relative to the first semiconductor layer wherein the electrically insulative layer is absent between the semiconductor device and the portion of the transducer.

9. The electronic component of claim 5 wherein:

the transducer has an electrical contact located at the first side of the composite semiconductor substrate; and the transducer is located directly underneath the semiconductor device.

10. The electronic component of claim 9 wherein:

the composite semiconductor substrate has a via extending through the first semiconductor layer and the electrically insulative layer; and the electrical contact extends from the first side of the composite semiconductor substrate through the via to contact the second semiconductor layer.

11. The electronic component of claim 5 wherein:

the transducer is an accelerometer having an axis of sensitivity substantially parallel to the first and second sides of the composite semiconductor substrate.

12. The electronic component of claim 5 wherein:

the first semiconductor layer is comprised of crystalline silicon having a <100> direction; and the second semiconductor layer is comprised of crystalline silicon having a <100> direction.

13. The electronic component of claim 5 wherein:

the first semiconductor layer is comprised of crystalline silicon having a <100> direction; and the second semiconductor layer is comprised of crystalline silicon having a <110> direction.

14. The electronic component of claim 5 wherein the second semiconductor layer is comprised of polysilicon.

15. The electronic component of claim 1 comprising:

a cap adjacent to the transducer and coupled to the second side of the composite semiconductor substrate.

16. An electronic component comprising:

a silicon-on-insulator substrate having a first side opposite a second side, the silicon-on-insulator substrate comprising:
  a first silicon layer at the first side;
  a second silicon layer at the second side; and
  a silicon dioxide layer located between the first and second silicon layers;

a plurality of transistors located at least partially in the first silicon layer;

multi-layered interconnect system located over the plurality of transistors and the first side of the silicon-on-insulator substrate wherein the multi-layered interconnect system electrically couples together the plurality of transistors; and an electromechanical transducer located at least partially in the second silicon layer.

17. The electronic component of claim 16 wherein:

the electromechanical transducer has an axis of sensitivity substantially parallel to the first and second sides of the silicon-on-insulator substrate.

18. The electronic component of claim 16 wherein:

the silicon-on-insulator substrate includes a via extending through the first silicon layer and the silicon dioxide layer; and the electro-mechanical transducer has an electrical contact at the first side of the silicon-on-insulator substrate and located in the via.

19. The electronic component of claim 16 wherein:

the plurality of transistors is located directly over the electro-mechanical transducer.

20. The electronic component of claim 16 comprising:

a cap adjacent to the electro-mechanical transducer and coupled to the second silicon layer.

21. An electronic component comprising:

a silicon-on-insulator substrate comprising a first side and a second side opposite the first side, a first silicon layer at the first side, a second silicon layer at the second side, and a silicon dioxide layer located between the first and second silicon layers, wherein the silicon-on-insulator substrate has a hole extending through the first silicon layer and the silicon dioxide layer; and an electrical contact to the second silicon layer located at the first side of the silicon-on-insulator substrate wherein the electrical contact is comprised of an electrically conductive layer covering a portion of the first silicon layer, extending into the hole through the first silicon layer, and extending into the hole through the silicon dioxide layer to electrically contact the second silicon layer.

* * * * *

UNITED STATES PATENT AND TRADEMARK OFFICE
CERTIFICATE OF CORRECTION

PATENT NO. : 6,720,635 B1  Page 1 of 1
DATED : April 13, 2004
INVENTOR(S) : Daniel J. Koch et al.

It is certified that error appears in the above-identified patent and that said Letters Patent is hereby corrected as shown below:

<u>Column 7,</u>
Line 28, change "multi-layered interconnect" to -- a multi-layered interconnect --.

Signed and Sealed this

Twenty-first Day of December, 2004

JON W. DUDAS
*Director of the United States Patent and Trademark Office*